United States Patent
Kai et al.

(10) Patent No.: US 8,980,664 B2
(45) Date of Patent: Mar. 17, 2015

(54) METHOD FOR FABRICATING STACKED NITRIDE-COMPOUND SEMICONDUCTOR STRUCTURE AND METHOD FOR FABRICATING NITRIDE-COMPOUND SEMICONDUCTOR LIGHT EMITTING DEVICE

(75) Inventors: Kenichiro Kai, Fukuoka-ken (JP); Hideto Sugawara, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 13/416,797

(22) Filed: Mar. 9, 2012

(65) Prior Publication Data

US 2013/0065341 A1 Mar. 14, 2013

(30) Foreign Application Priority Data

Sep. 14, 2011 (JP) ................. P2011-200511

(51) Int. Cl.
*H01L 21/00* (2006.01)
*H01L 21/02* (2006.01)
*H01L 33/00* (2010.01)

(52) U.S. Cl.
CPC ...... *H01L 21/0254* (2013.01); *H01L 21/02381* (2013.01); *H01L 21/02433* (2013.01); *H01L 21/02458* (2013.01); *H01L 21/0262* (2013.01); *H01L 21/02658* (2013.01); *H01L 33/007* (2013.01)
USPC .................................. 438/47; 438/46; 438/94

(58) Field of Classification Search
USPC ................................ 438/46, 47, 94
See application file for complete search history.

(56) References Cited

U.S. PATENT DOCUMENTS

| | | | | |
|---|---|---|---|---|
| 5,412,226 | A * | 5/1995 | Rejman-Greene et al. | 257/21 |
| 6,501,101 | B2 * | 12/2002 | Murakami et al. | 257/79 |
| 7,791,106 | B2 * | 9/2010 | Piner et al. | 257/191 |
| 7,982,242 | B2 * | 7/2011 | Goto | 257/200 |
| 8,030,665 | B2 * | 10/2011 | Nagahama et al. | 257/79 |
| 8,680,561 | B2 * | 3/2014 | Kitagawa et al. | 257/99 |
| 2004/0065889 | A1 * | 4/2004 | Ueda et al. | 257/82 |
| 2006/0194360 | A1 * | 8/2006 | Takeuchi et al. | 438/46 |

(Continued)

FOREIGN PATENT DOCUMENTS

| | | |
|---|---|---|
| JP | H0432223 A | 2/1992 |
| JP | 2003113000 A | 4/2003 |

(Continued)

OTHER PUBLICATIONS

Japanese Office Action dated Jan. 28, 2014, filed in Japanese counterpart Application No. 2011-200511, 7 pages (with translation).
Taiwanese Office Action dated Jul. 15, 2014, filed in Taiwan counterpart Application No. 101107491, 7 pages (with translation).

*Primary Examiner* — Bac Au
(74) *Attorney, Agent, or Firm* — Patterson & Sheridan, LLP (57) ABSTRACT

According to one embodiment, a method for fabricating a stacked nitride-compound semiconductor structure includes forming a first protection film on a second surface of a substrate, forming a first nitride-compound semiconductor layer on the first surface of the substrate, forming a second protection film on the first nitride-compound semiconductor layer, removing the first protection film to expose the second surface of the substrate, forming a second nitride-compound semiconductor layer on the second surface of the substrate, and removing the second protection film to expose the first surface of the second nitride-compound semiconductor layer.

19 Claims, 10 Drawing Sheets

(56) References Cited

U.S. PATENT DOCUMENTS

| | | |
|---|---|---|
| 2008/0116456 A1 | 5/2008 | Piner et al. |
| 2008/0203382 A1* | 8/2008 | Yanagihara ............... 257/18 |
| 2008/0296609 A1 | 12/2008 | Nagahama et al. |
| 2011/0204395 A1* | 8/2011 | Hong et al. ............... 257/94 |
| 2011/0266522 A1* | 11/2011 | Kim et al. ................ 257/22 |
| 2011/0281987 A1 | 11/2011 | Godwin et al. |
| 2012/0061640 A1* | 3/2012 | Kitagawa et al. .......... 257/13 |

FOREIGN PATENT DOCUMENTS

| | | |
|---|---|---|
| JP | 2005-116785 | 4/2005 |
| JP | 2005116785 A | 4/2005 |
| JP | 2010272781 A | 12/2010 |
| JP | 2011077100 A | 4/2011 |
| TW | 200520060 A | 11/2011 |

\* cited by examiner

METHOD FOR FABRICATING STACKED NITRIDE-COMPOUND SEMICONDUCTOR STRUCTURE AND METHOD FOR FABRICATING NITRIDE-COMPOUND SEMICONDUCTOR LIGHT EMITTING DEVICE

CROSS REFERENCE TO RELATED APPLICATION

This application is based upon and claims the benefit of priority from prior Japanese Patent Application No. 2011-200511, filed on Sep. 14, 2011, the entire contents of which are incorporated herein by reference.

FIELD

Exemplary embodiments described herein generally relate to a method for fabricating a stacked nitride-compound semiconductor structure and a method for fabricating a nitride-compound semiconductor light emitting device.

BACKGROUND

Different kinds of substrates such as a sapphire substrate, a silicon substrate or the like are used as a substrate to grow a nitride-compound semiconductor.

Thermal expansion coefficient of the nitride-compound semiconductor is different from that of the different kind of each substrate. Therefore, warpage is generated in the stacked nitride-compound semiconductor structure which is constituted with nitride-compound semiconductors on the different kind of the substrate.

Conventionally, a stacked nitride-compound semiconductor structure mentioned below has been well known. Nitride-compound semiconductor layers with an active layer and another nitride-compound semiconductor layer are provided on a surface and a back surface of the substrate, respectively, in the stacked nitride-compound semiconductor structure.

Such the stacked nitride-compound semiconductor structure is fabricated as follows to decrease the warpage. First, the nitride-compound semiconductor layer is formed on the back surface of the substrate. Next, the nitride-compound semiconductor layers with the active layer are formed on the surface of the substrate.

In the processing steps to provide the nitride-compound semiconductor layer on the back surface of the substrate, process gas is penetrated into a side of the surface of the substrate. Further, deposition substances are attached to an outer periphery portion of the surface of the substrate. When the deposition substances remain, crystalline defects are generated in the nitride-compound semiconductor layers with the active layer so as to degrade device characteristics and device yield.

Accordingly, it is necessary to remove the deposition substances on the substrate without damage to the surface of the substrate prior to form the nitride-compound semiconductor layers with the active layer on the substrate.

However, nitride-compound semiconductor has a strong resistance to chemicals. As a result, there arises a problem that the deposition substances cannot be sufficiently removed to leave residues.

When the different kind of the substrate is composed of silicon, especially, there arises a problem that even retaining flatness of a surface of the substrate is difficult, as silicon is strongly reacted with gallium.

It is considered that the surface of the silicon substrate is polished again. However, the stacked nitride-compound semiconductor structure has warpage in this step. Therefore, the structure has difficulty even in retaining the flatness of the surface of the substrate.

Furthermore, warpage is proportional to square of a diameter. When a substrate with larger diameter is used in the process, more severe problem may be generated.

DETAILED DESCRIPTION

According to one embodiment, a method for fabricating a stacked nitride-compound semiconductor structure includes forming a first protection film on a second surface of a substrate having a first thermal expansion coefficient, the second surface configured to be opposed to a first surface of the substrate, forming a first nitride-compound semiconductor layer on the first surface of the substrate, the first nitride-compound semiconductor layer having a second thermal expansion coefficient which is different from the first thermal expansion coefficient, forming a second protection film on the first nitride-compound semiconductor layer, removing the first protection film to expose the second surface of the substrate, forming a second nitride-compound semiconductor layer on the second surface of the substrate, the second nitride-compound semiconductor layer having a third thermal expansion coefficient which is approximately equal to the second thermal expansion coefficient, and removing the second protection film to expose a surface the second nitride-compound semiconductor layer.

Hereinbelow, embodiments will be described with reference to the drawings.

First Embodiment

Figure 1:
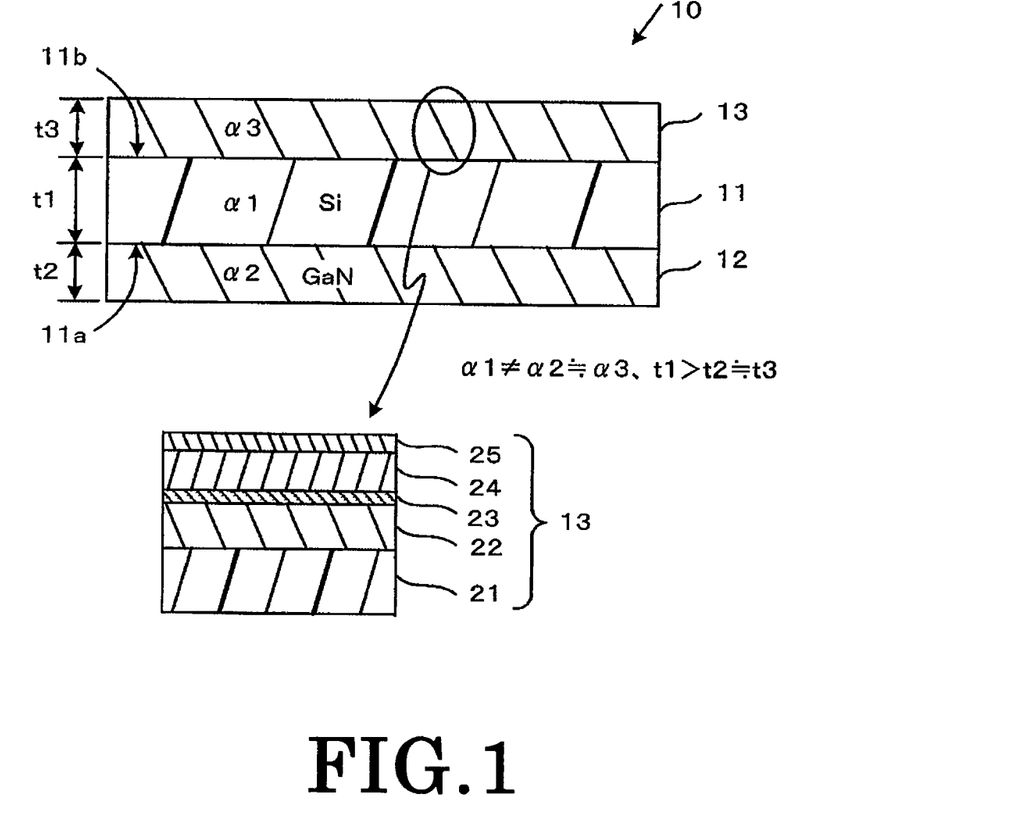
FIG. 1 is a cross-sectional view showing a stacked nitride-compound semiconductor structure according to a first embodiment.
Figure 2A:
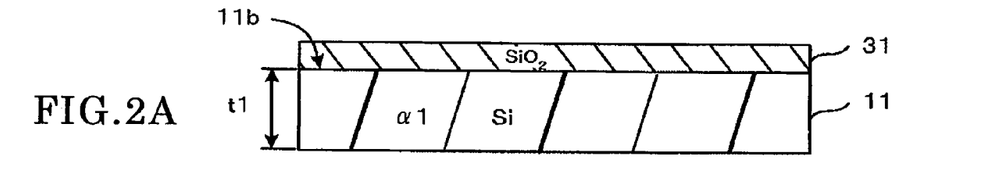
FIGS. 2A-2C are cross-sectional views showing a method for fabricating the stacked nitride-compound semiconductor structure in order according to the first embodiment.
Figure 2B:
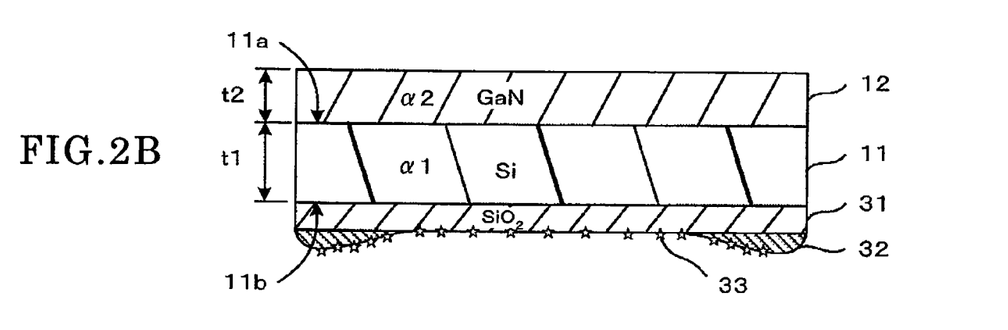
Figure 2C:
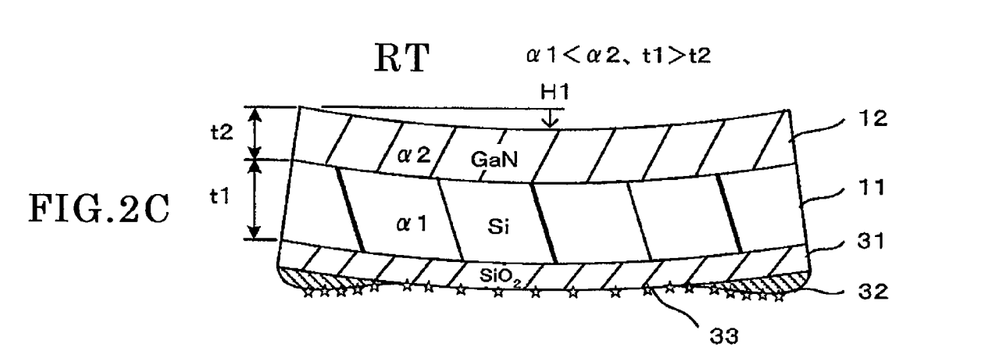
Figure 3A:
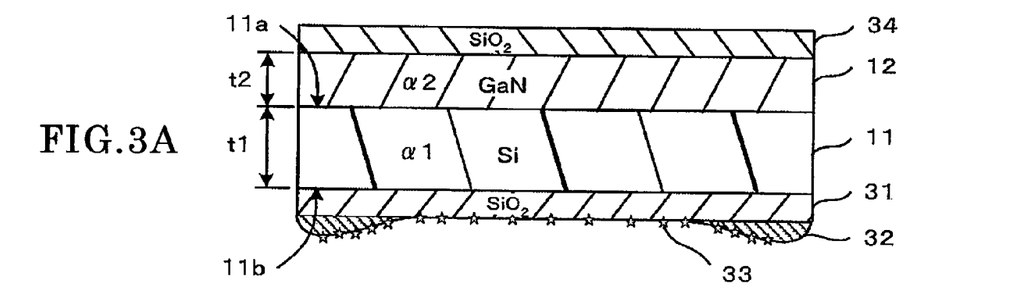
FIGS. 3A-3C are cross-sectional views showing the method for fabricating the stacked nitride-compound semiconductor structure in order according to the first embodiment.
Figure 3B:
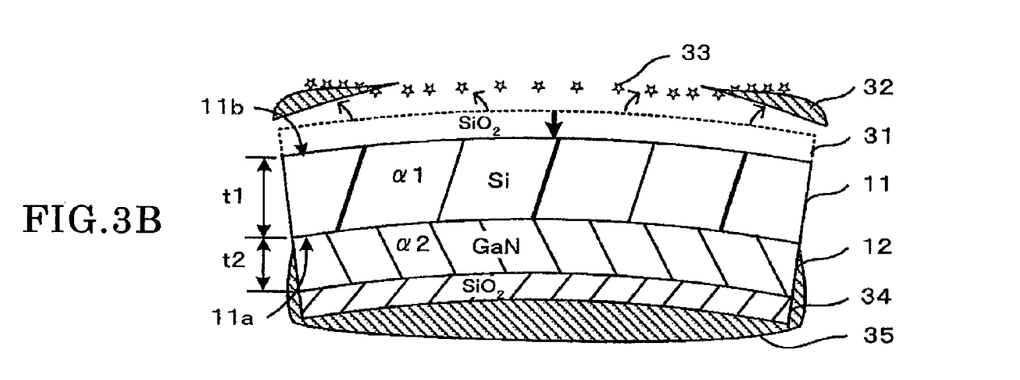
Figure 3C:
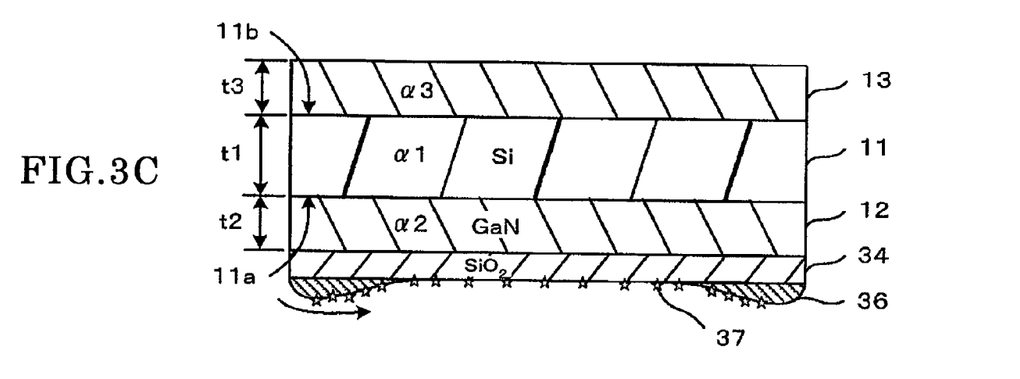
Figure 4A:
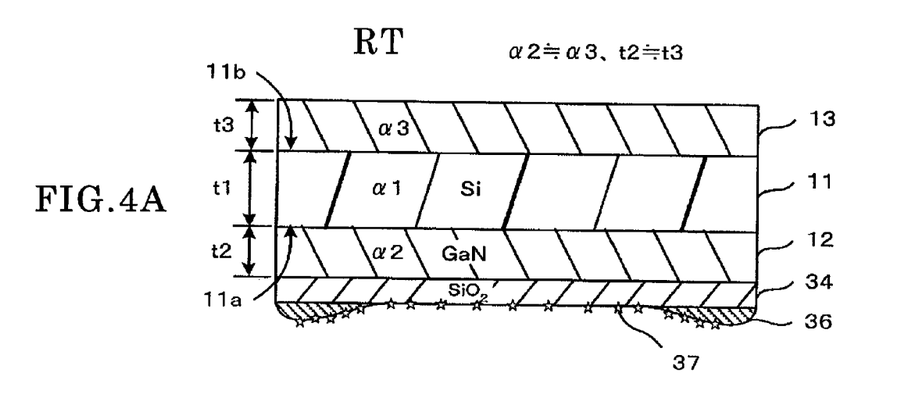
FIGS. 4A-4B are cross-sectional views showing the method for fabricating the stacked nitride-compound semiconductor structure in order according to the first embodiment.
Figure 4B:
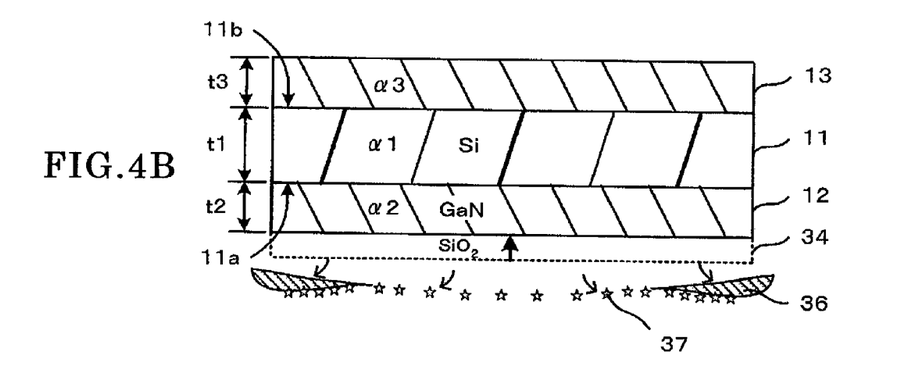

A method for fabricating the stacked nitride-compound semiconductor structure according to a first embodiment is explained by using FIG. 1-FIGS. 4A-4C. FIG. 1 is a cross-sectional view showing a stacked nitride-compound semiconductor structure according to the first embodiment. FIGS. 2-4 are cross-sectional views showing the method for fabricating the stacked nitride-compound semiconductor structure in order according to the first embodiment;

The stacked nitride-compound semiconductor structure according to the first embodiment is used as a production for a nitride-compound semiconductor light emitting device. Nitride-compound semiconductor layers are formed on both surfaces of a different kind of a substrate to balance stress caused by difference between thermal expansion coefficients of the nitride-compound semiconductor layers formed on both surfaces. Accordingly, warpage of the substrate can be decreased.

As shown in FIG. 1, a substrate 11 has a first surface 11a and a second surface 11b opposed to the first surface 11a in the stacked nitride-compound semiconductor structure of the first embodiment. Further, the stacked nitride-compound semiconductor structure 10 has first thermal expansion coefficient $\alpha 1$.

A first nitride-compound semiconductor layer 12 is provided on the first surface 11a of the substrate 11. The first nitride-compound semiconductor layer 12 has second thermal expansion coefficient $\alpha 2$ which is different from the first thermal expansion coefficient $\alpha 1$. A second nitride-compound semiconductor layer 13 is provided on the second surface 11b of the substrate 11. The second nitride-compound semiconductor layer 13 has third thermal expansion coefficient $\alpha 3$ which is nearly equal to the second thermal expansion coefficient $\alpha 2$.

The substrate 11 has a diameter of nearly 150 mm and a thickness t1 of nearly 500 μm, for example. The first thermal expansion coefficient al of the substrate 11 is nearly $2.4 \times 10^{-6}$/K.

The first nitride-compound semiconductor layer 12 is constituted with a gallium nitride (GaN) layer which has a thickness t2 of nearly 5 μm, for example. The first nitride-compound semiconductor layer 12 has the second thermal expansion coefficient $\alpha 2$ of nearly $3.17 \times 10^{-6}$/K.

The second nitride-compound semiconductor layer 13 is a stacked structure which is sequentially constituted with a GaN layer 21, an n-type GaN clad layer 22, an MQW layer 23, a p-type GaN clad layer 24 and a p-type GaN contact layer 25.

As the second nitride-compound semiconductor layer 13 has been well known, an explanation is simply described below. The GaN layer 21 is an underlying single crystalline layer to grow from the n-type GaN clad layer 22 to the p-type GaN contact layer 25. The GaN layer 21 has a thickness of 3 μm, for example, which is comparatively thicker. The n-type GaN clad layer 22 has a thickness of nearly 2 μm, for example.

The MQW layer 23 is alternately stacked with seven GaN barrier layers and seven InGaN quantum well layers as a multiple quantum well structure and the topmost layer of the MQW layer 23 is constituted with the InGaN quantum well layer. Each of the GaN barrier layers has a thickness of nearly 5 nm and each of the InGaN quantum well layers has a thickness of nearly 2.5 nm.

The p-type GaN clad layer 24 is formed to have a thickness of nearly 100 nm, for example, and the p-type GaN contact layer 25 is formed to have a thickness of nearly 10 nm, for example.

An indium composition ratio x of the InGaN quantum well layer ($In_xGa_{1-x}$ layer, $0 \leq x \leq 1$) is set to be nearly 0.1, in such a manner a peak wave length of emission light from the second nitride-compound semiconductor layer 13 set at 450 nm, for example.

The second nitride-compound semiconductor layer 13 has a thickness t3 of nearly 5.16 μm which is almost occupied by the GaN layer 21 and the n-type GaN clad layer 22.

A method for fabricating a stacked nitride-compound semiconductor structure 10 is described below. First, a second nitride-compound semiconductor layer 12 is formed on a first surface 11a of a substrate 11 in the method for fabricating the stacked nitride-compound semiconductor structure 10 according to the first embodiment. Successively, a second nitride-compound semiconductor layer 13 is formed on a second surface 11b. Processing steps are constructed to easily remove deposition substances which are attached to one surface opposed to the other surface on which the nitride-compound semiconductor layer is formed.

In such a manner, generation of crystalline defects in the second nitride-compound semiconductor layer 13 due to the deposition substances formed at the side of the second surface 11b are protected. Further, flatness degradation of the substrate 11 due to the deposition substances on the first surface is prevented. Accordingly, degradation of device characteristics and lowering of device yield on device fabrication are prevented.

As shown in FIG. 2A, a silicon substrate with a plane orientation (111) ±2° is used as the substrate 11. A silicon oxide film is formed on the second surface 11b of the substrate 11 as the first protection film 31, for example, by CVD.

The first protection film 31 is provided to prevent the deposition substances from directly attaching to the second surface 11b and to easily remove the deposition substances from the substrate 11. It is preferable to use a dense film and to have a thickness of 100-300 nm as the first protection film 31.

As shown in FIG. 2B, the substrate 11 is reversed. The first nitride-compound semiconductor layer 12 with a thickness of nearly 5 μm is provided on the first surface 11a of the substrate 11 by MOCVD (Metal Organic Chemical Vapor Deposition).

In the processing step, process gas is penetrated into a side of the second surface 11b of the substrate 11. Further, the deposition substances 32 and the particles 33 are attached to an outer periphery portion of the first protection film 31. The deposition substances 32 and the particles 33 are mainly composed of polycrystalline GaN.

As the second surface 11b of the substrate 11 is covered with the first protection film 31, the deposition substances 32 and the particles 33 are not attached on the second surface 11b of the substrate 11. As the substrate 11 is retained at a growth temperature, therefore, the substrate 11 has not warpage.

FIG. 2C shows the substrate 11 at room temperature. Warpage H1 is generated in the substrate 11 at room temperature due to a difference of thermal expansion coefficient between Si and GaN, so that the side of the first nitride-compound semiconductor layer 12 deforms to be concave.

As a method of providing the GaN layer on the silicon substrate is well-known, an explanation is simply described below. After cleaning the silicon substrate by organic material or acid material as pre-treatment, the silicon substrate is installed in a reactor of an MOCVD apparatus.

Next, the silicon substrate is heated up to 1100° C. in hydrogen gas ambient, for example. In such a manner, the surface of the silicon substrate is etched in gas-phase, so that a natural silicon oxide formed on the surface is removed.

An Al-nitride (AlN) buffer layer is formed on the silicon substrate by supplying $NH_3$ gas and Tri-methyl Aluminum (TMA) gas as process gases, for example, and a mixed gas of $N_2$ gas and $H_2$ gas as a carrier gas.

Next, the temperature of the silicon substrate is lowered down to 1050° C., for example. A GaN layer is formed on the AlN buffer layer by supplying $NH_3$ gas and Tri-methyl Gallium (TMG) gas as the process gases, for example, and the mixed gas of $N_2$ gas and $H_2$ gas as the carrier gas.

Further, the $NH_3$ gas and the carrier gas is continuously supplying while the TMG gas is stopped to be supplied, and the temperature of the silicon substrate is spontaneously lowered. Further, the $NH_3$ gas is continuously supplied till the temperature of the silicon substrate is lowered down to 500° C.

As shown in FIG. 3A, a silicon oxide film is formed on the first nitride-compound semiconductor layer 12 as a second protection film 34 by CVD.

The second protection film 34 is provided to prevent the deposition substances from directly being deposited on the first nitride-compound semiconductor layer 12. A thickness of the second protection film 34 is suitably set to be nearly the same as the thickness of the first protection film 31.

As shown in FIG. 3B, the first protection film 31 is removed after covering a surface and side surfaces of the second protection film 34 by a third protection film 35. In such a manner, the second surface 11b of the substrate is exposed.

A removal process of the first protection film 31 is conducted by using a chemical solution with hydrogen fluoride, for example. A wax such as paraffin is suitable as the third protection film 35.

In the removal process, the deposition substances 32 and particles 33 are not etched by the chemical solution. On the other hand, the first protection film 31 under the deposition substances 32 and particles 33 is side-etched to force the deposition substances 32 and particles 33 to float on the chemical solution from the substrate.

As a result, the deposition substances 32 and particles 33 can be removed without damages to the second surface 11b of the substrate 11.

As shown in FIG. 3C, the second nitride-compound semiconductor layer 13 is formed on the second surface 11b of the silicon substrate after removing the third protection film by an organic chemical solution.

In the processing step, the process gas is penetrated into a side of the first surface 11A of the substrate 11, further, deposition substances 36 and particles 37 are attached to an outer periphery portion of the second protection film 34. The deposition substances 36 and the particles 37 are mainly composed of polycrystalline GaN.

As the first nitride-compound semiconductor layer on the substrate 11 is covered with the second protection film 34, the deposition substances 36 and the particles 37 are not attached on the first nitride-compound semiconductor layer. As the substrate 11 is retained at a growth temperature, therefore, the substrate 11 is not warpage.

FIG. 4A shows a state of the substrate 11 in room temperature. Stress caused by difference of thermal expansion coefficient between silicon and GaN is decreased by forming the first nitride-compound semiconductor layer and the second nitride-compound semiconductor layer on the first surface and the second surface of the silicon substrate, respectively, to decrease the warpage of the silicon substrate in room temperature.

As the method for fabricating the second nitride-compound semiconductor layer 13 has been well known, an explanation is simply described below. A GaN layer with a thickness of 3 μm is formed by the same process as shown in FIG. 2B.

An n-type GaN clad layer 22 with a thickness of 2 μm is formed by adding $SiH_4$ gas, for example, as a source gas of n-type impurities to the process gas. Successively, the $NH_3$ gas is continuously supplied while the $SiH_4$ gas and the TMG gas are stopped to be supplied, and the temperature of the substrate 11 is lowered down to below 1100° C., for example, 800° C. and is retained at 800° C.

A GaN barrier layer with a thickness of 5 nm is formed on the n-type GaN clad layer by using $N_2$ gas as a carrier gas and $NH_3$ gas as a process gas, for example. Further, an InGaN quantum-well layer with a thickness of 2.5 μm and an indium composition ratio of 0.1 is formed by adding Tri-methyl Indium (TMI) gas in the carrier gas and the process gas.

Forming the GaN barrier layer and forming the InGaN quantum-well layer are repeated seven times by intermittently supplying the Tri-methyl Indium gas to obtain an MQW layer 23.

Successively, the TMG gas and the $SiH_4$ gas are continuously supplied while the TMI gas is stopped to be supplied to form an undoped GaN cap layer with a thickness of 5 nm.

Further, the $SiH_4$ gas is continuously supplied while the TMG gas is stopped to be supplied, and the temperature of the substrate 11 is heated up to over 800° C., for example, 1030° C. and is retained at 1030° C.

A p-type GaN clad layer 24 with a magnesium concentration of $1 \times 10^{20}$ $cm^{-3}$ and a thickness of nearly 100 nm is formed on the MQW layer 23 by supplying $NH_3$ gas and TMG gas as process gases, for example, biscyclopentadienyl magnesium (Cp2Mg) gas as a doping gas and mixed gas of $N_2$ gas and $H_2$ gas as carrier gases.

Next, the Cp2Mg gas is increased to form a p-type GaN contact layer 25 with a magnesium concentration of $1 \times 10^{21}$ $cm^{-3}$ and a thickness of nearly 10 nm on the p-type GaN clad layer 24.

The $NH_3$ gas and the carrier gases are continuously supplied while the $NH_3$ gas and the Cp2Mg gas are stopped to be provided, and the temperature of the silicon substrate 11 is spontaneously lowered. The $NH_3$ gas is continuously supplied till the temperature of the silicon substrate 11 is lowered down to 500° C.

In such a manner, the second nitride-compound semiconductor layer 13 is formed on the second surface 11b of the substrate 11 and the p-type GaN contact layer 25 is constituted as a surface of the second nitride-compound semiconductor layer 13.

As shown in FIG. 4B, the second protection film 34 is removed to expose the first nitride-compound semiconductor layer 12. The second protection film 34 is removed by using a chemical solution with hydrogen fluoride as the same method as removing the first protection film.

In the removal process, the deposition substances 36 and particles 37 are not etched by the chemical solution. On the other hand, the second protection film 34 under the deposition substances 36 and particles 37 is side-etched to force the deposition substances 36 and particles 37 to float on the chemical solution from the substrate.

As a result, the deposition substances 36 and particles 37 can be simultaneously removed with the second protection film 34 without damages to the first surface 11a of the silicon substrate.

In such a manner, the stacked nitride-compound semiconductor structure 10 in which the first nitride-compound semiconductor layer 12 is formed on the first surface 11a of the substrate 11 and the second nitride-compound semiconductor layer 13 is formed on the second surface 11b of the substrate 11 as shown in FIG. 1.

As stress caused by difference of thermal expansion coefficient between the first surface side and the second surface side of the silicon substrate is balanced, the warpage of the silicon substrate in room temperature can be decreased.

Comparative Example

Next, a method for fabricating a stacked nitride-compound semiconductor structure according to a comparative example is described with reference to drawings. FIGS. 5A-5C and FIGS. 6A-6C are cross-sectional views showing the method for fabricating the stacked nitride-compound semiconductor structure according to the comparative example.

Processing steps of forming a first protection film 31 and a second protection film 34 are not included in the method for fabricating the stacked nitride-compound semiconductor structure according to the comparative example.

Figure 5A:
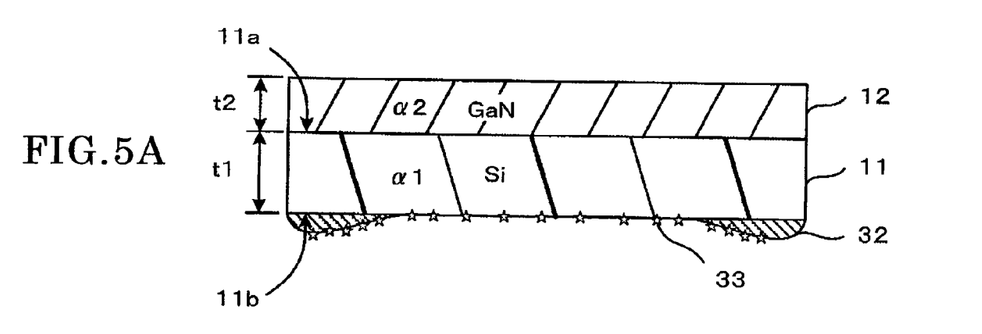
FIGS. 5A-5C are cross-sectional views showing a method for fabricating a stacked nitride-compound semiconductor structure in order according to a comparative example.

As shown in FIG. 5, a first nitride-compound semiconductor layer 12 is formed on a first surface 11a of a substrate 11 as the same as the process shown in FIG. 2.

In the processing step, process gas is penetrated into a side of the second surface 11b of the substrate 11. Further, the deposition substances 32 and the particles 33 are attached to an outer periphery portion of the second surface 11b of the substrate 11. As the substrate 11 is retained at a growth temperature, therefore, the substrate is not warpage in this stage.

On the other hand, Si is strongly reacted with Ga in the process gas. Accordingly, reaction products between Si and Ga other than polycrystalline GaN are included in the deposition substances 32.

Figure 5B:
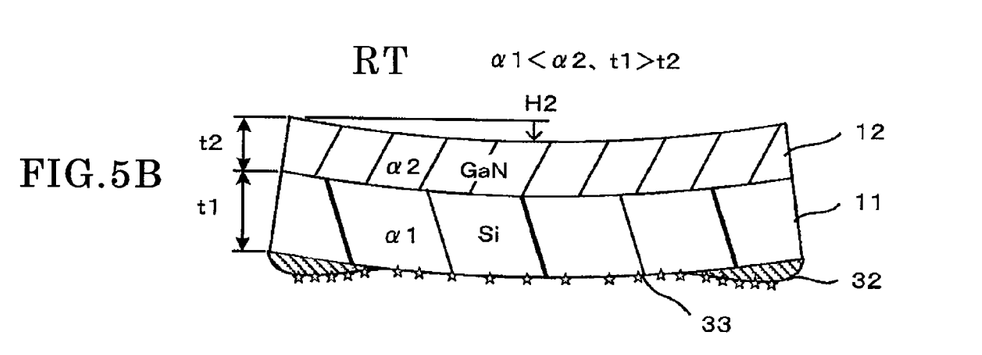

FIG. 5B shows the substrate 11 at room temperature. Warpage H2 is generated in the substrate 11 at room temperature due to difference of thermal expansion coefficient between Si and GaN, so that the side of the first nitride-compound semiconductor layer 12 deforms to be concave. The warpage H2 is nearly equal to the warpage H1 shown in FIG. 2C.

Figure 5C:
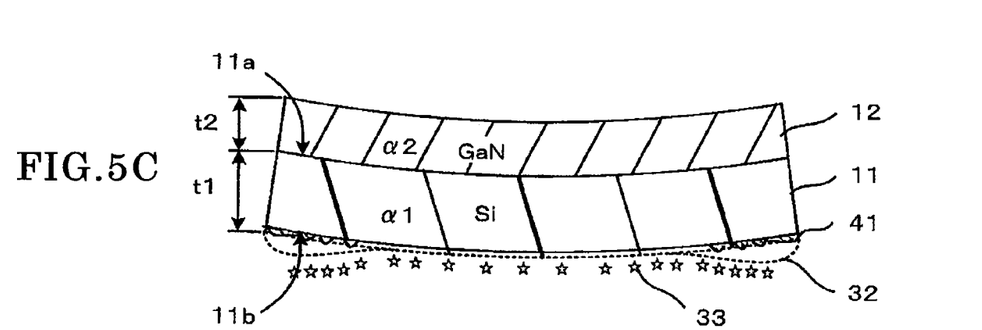

As shown in FIG. 5C, the second surface 11b of the substrate 11 is etched by a chemical solution with hydrogen fluoride and nitric acid, for example.

In the removal process, the deposition substances 32 and the particles 33 are not etched by the chemical solution. On the other hand, Si under the deposition substances 32 and particles 33 is side-etched to force the deposition substances 32 and particles 33 to float on the chemical solution from the substrate.

On the other hand, the reaction products between Si and Ga are included in the deposition substance 32. Therefore, the deposition substances 32 are not sufficiently removed, so that residues 41 are generated. When the substrate 11 is continuously etched, the substrate 11 under the residues 41 is grooved to generate concavity and convexity in the substrate 11. Therefore, it is difficult to retain flatness of the substrate 11.

As a result, the removal of the deposition substances 32 and particles 33 without damages to the second surface 11b of the substrate 11 become difficult.

For securing flatness, the second surface 11b of the substrate 11 may be polished again by chemical mechanical polishing (CMP). However, the substrate 11 has warpage in this step, therefore, the substrate 11 may be damaged in polishing.

Furthermore, warpage is proportional to square of diameter. When a substrate with larger diameter is used in the process, more severe problem may be generated.

Figure 6A:
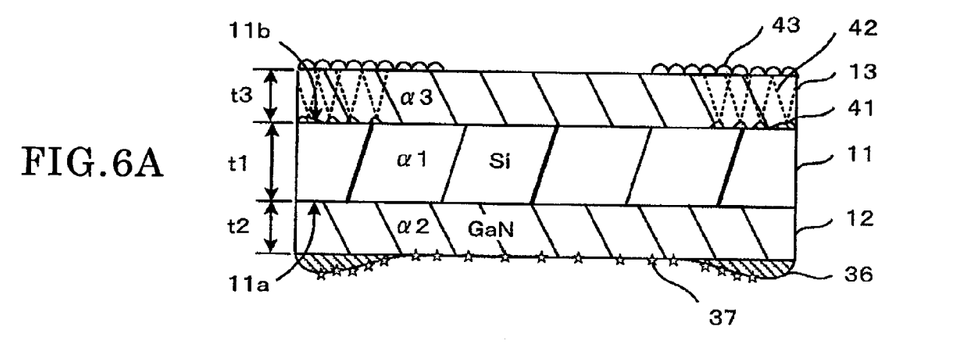
FIG. 6A-6B are cross-sectional views showing the method for fabricating the stacked nitride-compound semiconductor structure in order according to the comparative example.

As shown in FIG. 6A, the substrate 11 is reversed. The second nitride-compound semiconductor layer 13 is provided on the second surface 11b of the substrate 11 as the same process as shown in FIG. 3C.

In the deposition process, crystalline defects are generated in the second nitride-compound semiconductor layer 13 caused by the residues 41 on the second surface 11b of the substrate 11. As the second nitride-compound semiconductor layer 13 becomes thicker, white turbidities are generated on the surface of the second nitride-compound semiconductor layer 13 to deteriorate surface morphology.

When a nitride-compound semiconductor light emitting device is provided in the second nitride-compound semiconductor layer 13, device characteristics and device yield are degraded.

In the processing step, the process gas is penetrated into a side of the first surface 11a of the substrate 11. Further, deposition substances 36 and particles 37 are attached to an outer periphery portion of the first nitride-compound semiconductor layer 12. The deposition substances 36 and the particles 37 are mainly composed of polycrystalline GaN.

The deposition substances 36 are composed of GaN which is the same as the deposition substances 32 on the first surface 11a of the substrate 12 and are not sufficiently removed to degrade flatness of the substrate 11.

For securing flatness, the nitride-compound semiconductor layer 12 may be polished by CMP. As mentioned after, warpage of the substrate 11 is decreased, the nitride-compound semiconductor layer 12 can be polished. However, processing steps are increased as a problem.

Figure 6B:
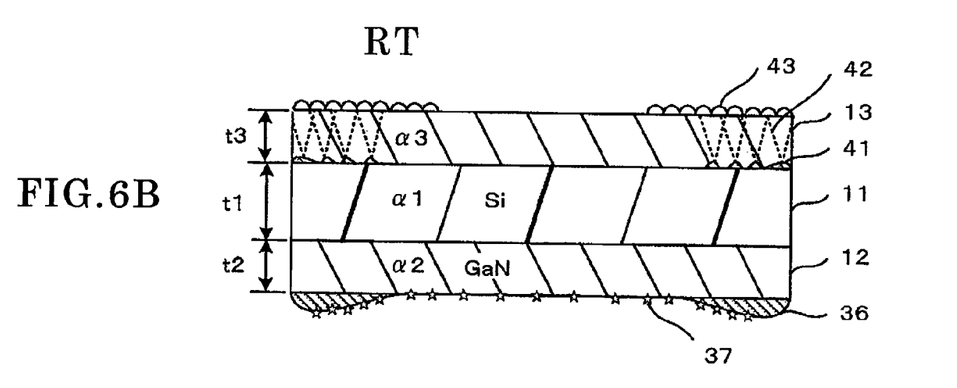

FIG. 6B shows a state of the substrate 11 in room temperature. Stress caused by difference of thermal expansion coefficient between silicon and GaN is decreased by forming the first nitride-compound semiconductor layer and the second nitride-compound semiconductor layer on the first surface and the second surface of the silicon substrate, respectively, to decrease the warpage of the silicon substrate in room temperature.

As mentioned above, it is difficult that the deposition substances 32 which is generated by penetration of the process gas to the back surface are sufficiently removed. Accordingly, the stacked nitride-compound semiconductor structure 10 as shown in FIG. 1 cannot be obtained.

Figure 7:
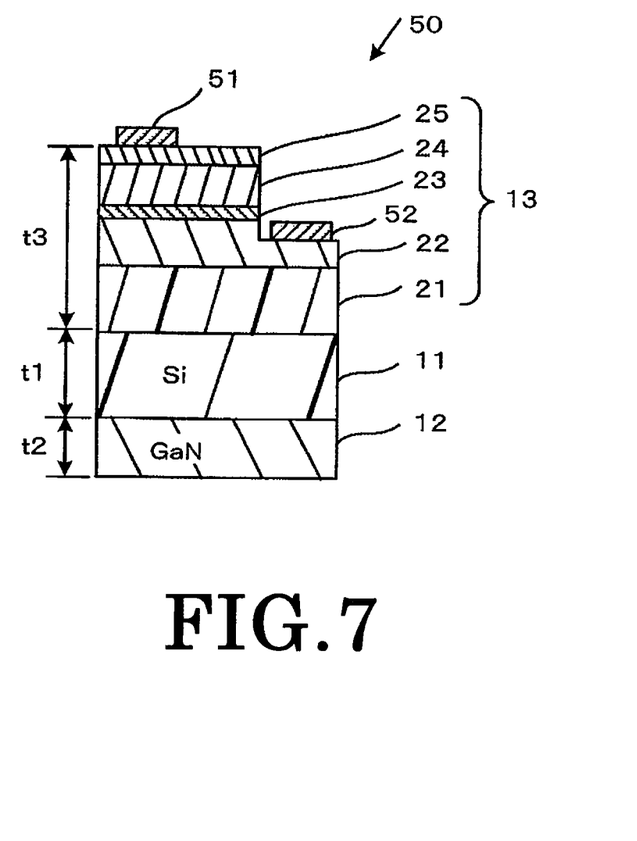
FIG. 7 is a cross-sectional view showing a nitride-compound semiconductor light emitting device constituted in a stacked nitride-compound semiconductor structure according to the first embodiment.

Next, a method for fabricating a nitride-compound semiconductor light emitting device in a stacked nitride-compound semiconductor structure is described. FIG. 7 is a cross-sectional view showing a nitride-compound semiconductor light emitting device constituted in the stacked nitride-compound semiconductor structure according to the first embodiment.

As shown in FIG. 7, a portion of one side of a second nitride-compound semiconductor layer 12 is removed from p-type GaN contact layer 25 to n-type GaN clad layer 22 in a nitride-compound semiconductor light emitting device 50. Removing the portion is performed by anisotropic reactive ion etching (RIE) using chlorine gas as an etching gas, for example.

A first electrode is provided on the portion of the p-type GaN contact layer 25. A second electrode is provided on a portion of exposed n-type GaN clad layer 22.

Al film is formed on the p-type GaN contact layer 25 by sputtering. The Al film is patterned by lithography to provide the first electrode 51. A Ti/Pt/Au stacked film is formed on the n-type GaN clad layer 22 by sputtering. The Ti/Pt/Au stacked film is patterned by lithography to provide the second electrode 52.

As a height of the nitride-compound semiconductor light emitting device 50 is equal to sum of t1, t2 and t3, it is desirable to preliminarily adjust a thickness t1 of the substrate 11 to fit to a target value. Further, the substrate 11 together with the first nitride-compound semiconductor layer 12 can be polished to be thinned. As a polishing process, after forming the first electrode and the second electrode, is a final process, so that the polishing process is not influenced with warpage.

As mentioned above, the method for fabricating the stacked nitride-compound semiconductor structure 10 according to the first embodiment includes forming the first protection film 31 and the second protection film 34.

As a result, the deposition substances 32 attached to the first protection film 31 in forming the first nitride-compound semiconductor layer 12 can be simultaneously removed in removing the first protection film 31.

Further, the deposition substances 36 attached to the second protection film 34 in forming the second nitride-compound semiconductor layer 13 can be simultaneously removed in removing the second protection film 34.

Accordingly, when the nitride-compound semiconductor layers is formed both surfaces of the substrate, a method for fabricating the stacked nitride-compound semiconductor structure having easily removing the deposition substances can be obtained.

A case which the substrate is silicon, is described, however, other different substrate can be available. Sapphire ($Al_2O_3$) having thermal expansion coefficient being nearly $5.3 \times 10^{-6}/K$, silicon carbide (SiC) having thermal expansion coefficient being nearly $4.68 \times 10^{-6}/K$, zinc oxide (ZnO) having thermal expansion coefficient being nearly $3.9 \times 10^{-6}/K$ or the like can be utilized.

A case which the first protection film 31 and the second protection film 34 are composed of silicon oxide, is described. However, it is not restricted to the above case, the same kind of films can be available. Silicon nitride can be selected as a material of the first protection film and the second protection film 34.

Figure 8:
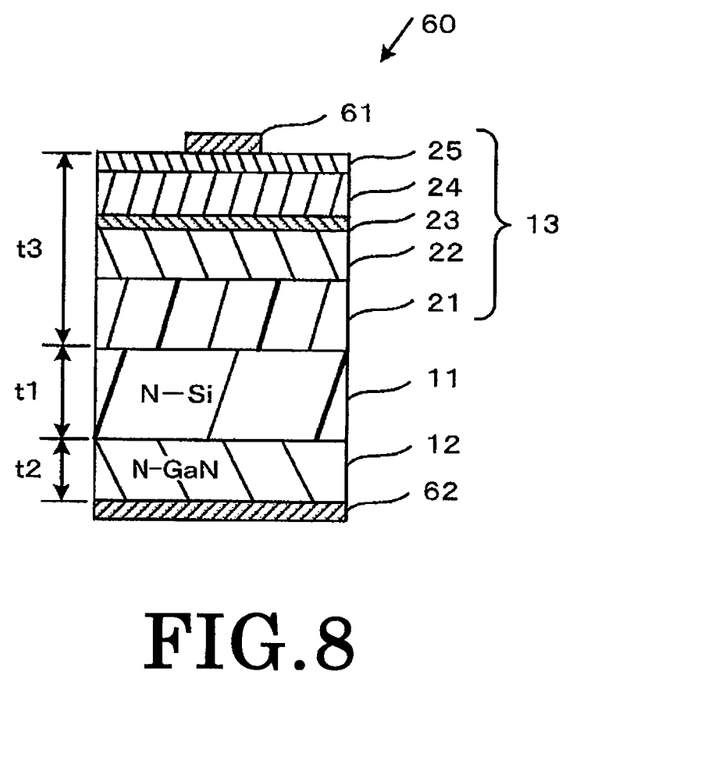
FIG. 8 is a cross-sectional view showing a nitride-compound semiconductor light emitting device constituted in a stacked nitride-compound semiconductor structure according to the first embodiment.

A case which the first electrode 51 and the second electrode 52 are configured to the side of the second nitride-compound semiconductor layer 13, is described as the nitride-compound semiconductor light emitting device. However, a case which the second electrode is configured to the side of the first nitride-compound semiconductor layer 12 can be available. FIG. 8 shows a nitride-compound semiconductor light emitting device 60 in which a second electrode is configured to a side of a first nitride-compound semiconductor layer.

As shown in FIG. 8, a first electrode 61 is provided on a portion of the first nitride-compound semiconductor layer 12 in the nitride-compound semiconductor light emitting device 60. A second electrode 62 is provided on entire first nitride-compound semiconductor layer 12.

Figure 9:
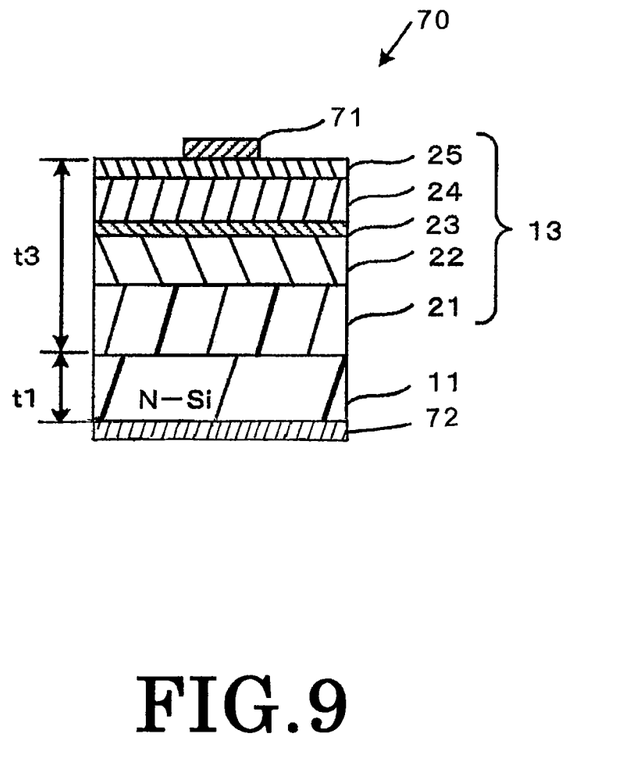
FIG. 9 is a cross-sectional view showing a nitride-compound semiconductor light emitting device constituted in a stacked nitride-compound semiconductor structure according to the first embodiment.

Further, as shown in FIG. 9, a second electrode 72 may be formed on an exposed surface of a substrate 11 after polishing the first nitride-compound semiconductor layer 12 and the substrate 11. In such process, as the surface of the substrate 11 is flat, the second electrode 72 is entirely formed on the surface. Accordingly, the electrode shape is simple, warpage is less influenced on the device. Further, the first electrode 71 is formed on a portion of the p-type GaN contact layer 25.

As an advantage to provide the second electrode 62 at the side of the first nitride-compound semiconductor layer 12, a size of the nitride-compound semiconductor light emitting device 60 can be smaller than a size of the nitride-compound semiconductor light emitting device 50.

It is necessary that resistivity of the second nitride-compound semiconductor layer 13 and resistivity of the GaN layer 21 are lowered as much as possible by doping Si as an n-type impurity in the second nitride-compound semiconductor layer and the GaN layer 21. It is desirable that the substrate 11 is composed of n-type Si with lower resistivity as less as possible.

Second Embodiment

Figure 10A:
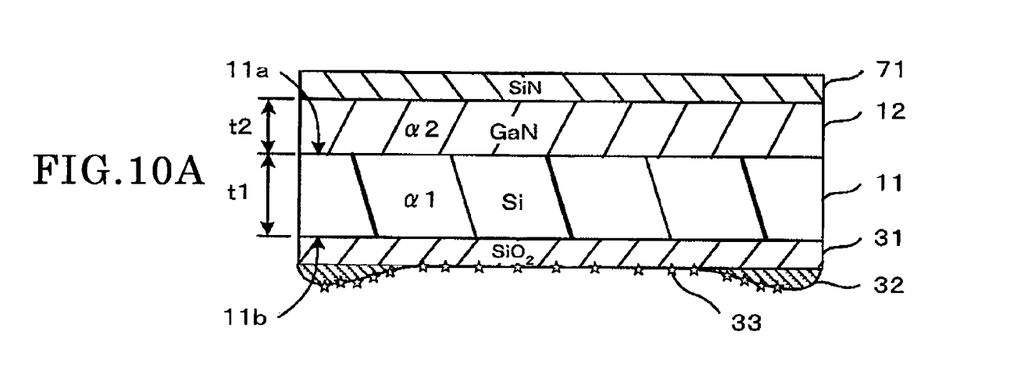
FIG. 10A-10C are cross-sectional views showing main processes of a method for fabricating a stacked nitride-compound semiconductor structure in order according to a second embodiment.
Figure 10B:
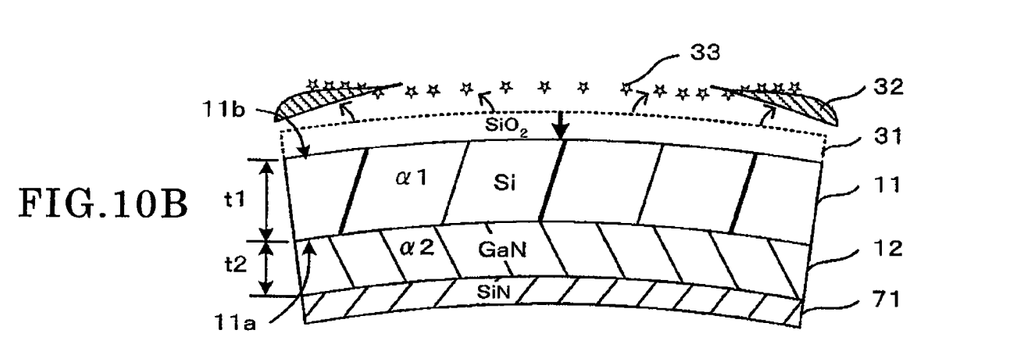
Figure 10C:
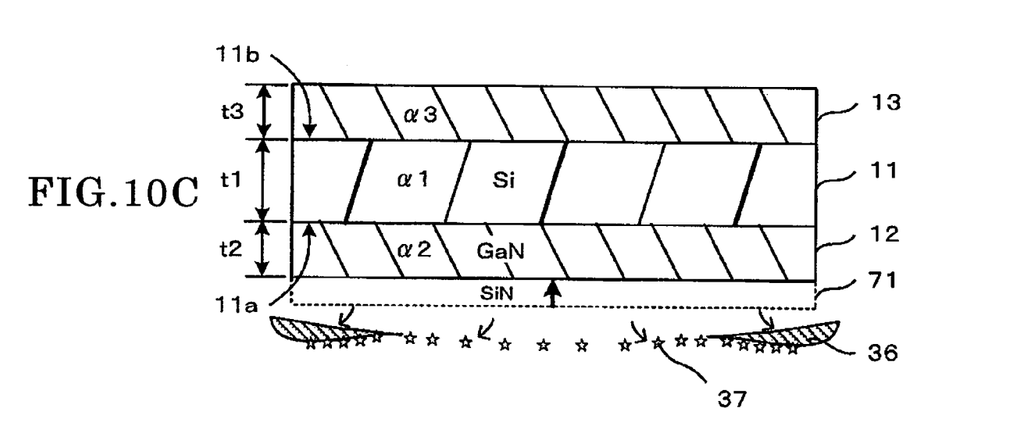

A method for fabricating a stacked nitride-compound semiconductor structure according to a second embodiment is described by using FIGS. 10A-10C.

Through the descriptions for the following embodiment, the same portions shown throughout the drawings will be denoted by the same reference numerals in the first embodiment. The second embodiment differs from the first embodiment in that the first protection film and the second protection film are composed of different material.

As shown in FIG. 10A, a silicon nitride film as a second protection film 71 is formed on a first semiconductor layer 12. The silicon nitride film is formed by plasma CVD, for example. A thin silicon oxide film as an underlying film is desirably formed to improve adhesion of the silicon nitride film.

As shown in FIG. 10B, a silicon oxide film as a first protection film 31 is removed by a chemical solution with hydrogen fluoride, for example. In the removing process, as the silicon nitride film as the second protection film is not etched, a third protection film 35 as shown in FIG. 3B is unnecessary.

As shown in FIG. 10C, the silicon nitride film as the second protection film 71 is removed by a mixed chemical solution including phosphoric acid and nitric acid, for example, at a temperature of 180° C.

As mentioned above, the second embodiment has an advantage as follows. As the second protection film 71 is composed of silicon nitride, covering the second protection film 71 is unnecessary when the first protection film 31 is removed.

A case which the second protection film is composed of silicon nitride is described, however, it is not restricted to the above case. A non-crystalline silicon film, an aluminum oxide film or the like can be available. The non-crystalline silicon film means a poly-crystalline film, an amorphous silicon film or a film mixed with the both films.

A chemical solution removing the first protection film may have selectivity to the second protection film and a chemical solution removing the second protection film may have selectivity to GaN.

Further, the first protection film and the second protection film can be exchanged each other, so that the second protection film can be composed of silicon oxide.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for fabricating a stacked nitride-compound semiconductor structure, comprising:
    forming a first protection film on a second surface of a substrate, the substrate having a first thermal expansion coefficient, the second surface being opposed to a first surface of the substrate;
    forming a first nitride-compound semiconductor layer on the first surface of the substrate, the first nitride-compound semiconductor layer having a second thermal expansion coefficient which is different from the first thermal expansion coefficient;
    forming a second protection film on the first nitride-compound semiconductor layer, the second protection film and first protection film being a same material;
    covering a surface and side surfaces of the second protection film with a third protection film, then using a chemical solution to remove the first protection film to expose the second surface of the substrate;
    forming a second nitride-compound semiconductor layer on the second surface of the substrate exposed by removing the first protection film, the second nitride-compound semiconductor layer having a third thermal expansion coefficient which is approximately equal to the second thermal expansion coefficient; and
    removing the second protection film to expose the first nitride-compound semiconductor layer.

2. The method of claim 1, wherein
a first deposition substance is formed on the first protection film in forming the first nitride-compound semiconductor layer and the first deposition substance is simultaneously removed with the first protection film in removing the first protection film.

3. The method of claim 1, wherein
a second deposition substance is formed on the second protection film in forming the second nitride-compound semiconductor layer and the second deposition substance is simultaneously removed with the second protection film in removing the second protection film.

4. The method of claim 1, wherein
removing the first protection film and the second protection film are performed by isotropic etching.

5. The method of claim 1, wherein
both the first protection film and the second protection film are composed of silicon oxide.

6. The method of claim 1, wherein
the substrate is composed of at least one material selected from silicon, sapphire, silicon carbide and zinc oxide.

7. The method of claim 1, wherein
the second nitride-compound semiconductor layer comprises a GaN layer, a first GaN clad layer, a multiple quantum well (MQW) layer, a second GaN clad layer, and a GaN contact layer stacked in order.

8. The method of claim 7, wherein
the MQW layer comprises a plurality of a GaN barrier layers and a plurality of InGaN quantum well layers provided in alternation with the plurality of GaN barrier layers, and the uppermost layer of the MQW layer is an InGaN quantum well layer.

9. A method for fabricating a stacked nitride-compound semiconductor structure, comprising:
    forming a first protection film on a second surface of a substrate, the substrate having a first thermal expansion coefficient, the second surface being opposed to a first surface of the substrate;
    forming a first nitride-compound semiconductor layer on the first surface of the substrate, the first nitride-compound semiconductor layer having a second thermal expansion coefficient which is different from the first thermal expansion coefficient;
    forming a second protection film on the first nitride-compound semiconductor layer, the second protection film and the first protection film being different materials;
    removing the first protection film to expose the second surface of the substrate using a chemical solution having a selectivity for the first protection film over the second protection film;
    forming a second nitride-compound semiconductor layer on the second surface of the substrate exposed by removing the first protection film, the second nitride-compound semiconductor layer having a third thermal expansion coefficient which is approximately equal to the second thermal expansion coefficient; and
    removing the second protection film to expose the first nitride-compound semiconductor layer.

10. The method of claim 9, wherein
the first protection film is composed of silicon oxide and the second protection film is composed of silicon nitride.

11. The method of claim 9, wherein
a first deposition substance is formed on the first protection film in forming the first nitride-compound semiconductor layer and the first deposition substance is simultaneously removed with the first protection film in removing the first protection film.

12. The method of claim 9, wherein
a second deposition substance is formed on the second protection film in forming the second nitride-compound semiconductor layer and the second deposition substance is simultaneously removed with the second protection film in removing the second protection film.

13. The method of claim 9, wherein
removing the first protection film and the second protection film are performed by isotropic etching.

14. The method of claim 9, wherein
the substrate is composed of at least one material selected from silicon, sapphire, silicon carbide and zinc oxide.

15. The method of claim 9, wherein
the second nitride-compound semiconductor layer comprises a GaN layer, a first GaN clad layer, a multiple quantum well (MQW) layer, a second GaN clad layer and a GaN contact layer stacked in order.

16. The method of claim 15, wherein
the MQW layer comprises a plurality of GaN barrier layers and a plurality of InGaN quantum well layers provided in alternation with the plurality of GaN barrier layers, and the uppermost layer of the MQW layer is an InGaN quantum well layer.

17. A method for fabricating a nitride-compound light emitting semiconductor device, comprising:
    forming a first protection film on a second surface of a substrate, the substrate having a first thermal expansion coefficient, the second surface being opposed to a first surface of the substrate;
    forming a first nitride-compound semiconductor layer on the first surface of the substrate, the first nitride-compound semiconductor layer having a second thermal expansion coefficient which is different from the first thermal expansion coefficient;
    forming a second protection film on the first nitride-compound semiconductor layer, the second protection film and the first protection film being a same material;
    covering a surface and side surfaces of the second protection film with a third protection film, then using a chemical solution to remove the first protection film to expose the second surface of the substrate;

forming a second nitride-compound semiconductor layer comprising a GaN layer, a first GaN clad layer, a multiple quantum well (MQW) layer, a second GaN clad layer, and a GaN contact layer respectively stacked in order on the second surface of the substrate exposed by removing the first protection film, the second nitride-compound semiconductor layer having a third thermal expansion coefficient which is approximately equal to the second thermal expansion coefficient;

removing the second protection film to expose the first nitride-compound semiconductor layer;

removing a portion of the second nitride-compound semiconductor layer, the portion extending from the GaN contact layer to the MQW layer, to expose a surface of the first GaN clad layer;

forming a first electrode on the GaN contact layer; and forming a second electrode on the first clad layer.

18. The method of claim 17, wherein a first deposition substance is formed on the first protection film in forming the first nitride-compound semiconductor layer and the first deposition substance is simultaneously removed with the first protection film in removing the first protection film.

19. The method of claim 17, wherein a second deposition substance is formed on the second protection film in forming the second nitride-compound semiconductor layer and the second deposition substance is simultaneously removed with the second protection film in removing the second protection film.

* * * * *